United States Patent
Ludurczak et al.

(10) Patent No.: US 12,310,156 B2
(45) Date of Patent: May 20, 2025

(54) OPTOELECTRONIC DEVICE AND MANUFACTURING METHOD

(71) Applicant: ALEDIA, Echirolles (FR)

(72) Inventors: Willy Ludurczak, Lyons (FR); Eric Pourquier, Grenoble (FR)

(73) Assignee: ALEDIA, Echirolles (FR)

( * ) Notice: Subject to any disclaimer, the term of this patent is extended or adjusted under 35 U.S.C. 154(b) by 0 days.

(21) Appl. No.: 18/901,832

(22) Filed: Sep. 30, 2024

(65) Prior Publication Data
US 2025/0113676 A1 Apr. 3, 2025

(30) Foreign Application Priority Data

Sep. 29, 2023 (FR) .................. FR2310409

(51) Int. Cl.
- *H10H 20/851* (2025.01)
- *H01L 25/16* (2023.01)
- *H10H 20/01* (2025.01)
- *H10H 20/824* (2025.01)

(52) U.S. Cl.
CPC ....... *H10H 20/8515* (2025.01); *H01L 25/167* (2013.01); *H10H 20/0361* (2025.01); *H10H 20/824* (2025.01)

(58) Field of Classification Search
CPC ..... H01L 33/507; H01L 33/30; H01L 25/167; H01L 2933/0041
See application file for complete search history.

(56) References Cited

U.S. PATENT DOCUMENTS

| | | | |
|---|---|---|---|
| 2017/0309798 A1* | 10/2017 | Bonar | H01L 33/0093 |
| 2018/0158808 A1* | 6/2018 | Zhang | H01L 25/167 |
| 2019/0302917 A1 | 10/2019 | Pan | |
| 2021/0183301 A1* | 6/2021 | Choi | H01L 33/346 |
| 2022/0149251 A1* | 5/2022 | Park | H01L 33/505 |
| 2022/0352441 A1 | 11/2022 | Lutgen et al. | |
| 2023/0105598 A1* | 4/2023 | Kim | C09K 11/703 257/40 |

OTHER PUBLICATIONS

French Search Report issued in FR 2310409; mailed Apr. 10, 2024.

* cited by examiner

*Primary Examiner* — Mark W Tornow

(74) *Attorney, Agent, or Firm* — Studebaker Brackett PLLC

(57) ABSTRACT

An optoelectronic device includes, in a stack, an emitting layer having optically active structures, configured to emit or receive radiation, a sensitive layer having at least one structure having a temperature resistance below a temperature Tmax below 200° C., a bond layer, and a transparent support layer. The bond layer is based on an inorganic low temperature bonding material. The bond layer also has cavities directly in line with the optically active structures, between the transparent support layer and the sensitive layer.

20 Claims, 5 Drawing Sheets

OPTOELECTRONIC DEVICE AND MANUFACTURING METHOD

TECHNICAL FIELD

The present invention relates to the field of technologies for microelectronics and optoelectronics. It finds particularly advantageous application in the manufacture of optoelectronic devices, notably pixels based on light emitting diodes (LEDs).

PRIOR ART

A self-emitting display screen is an example of optoelectronic device comprising a plurality of pixels emitting their own light. Each pixel is typically formed of several LEDs or micro-LEDs.

A pixel generally comprises at least three sub-pixels each emitting a radiation of different color, conventionally green, red and blue. RGB (Red Green Blue) sub-pixels may be obtained by adding different color conversion modules above similar LEDs. Thus, to form a pixel, it is for example possible to use three LEDs emitting only in blue, and to dispose a module for conversion from blue to red and another module for conversion from blue to green above two LEDs among the three blue LEDs. This avoids forming or locally transferring different types of LEDs. This solution typically makes it possible to minimize the manufacturing costs of a self-emitting screen.

According to one possibility, these LEDs are so-called "smart LEDs", typically comprising an optically active structure connected to a dedicated drive electronic, based on transistors. Groups of smart LEDs connected to independent control electronics, typically form "smart pixels".

The optoelectronic device may thus comprise a color conversion layer arranged on an emitting layer and/or an electronic layer under the emitting layer with interconnections between the electronic layer and the emitting layer.

To protect the components and handle them, and/or to improve the light extraction efficiency, a thick glass layer is formed above the emitting layer optionally comprising a color conversion layer. Assembly methods are already known for assembling this thick glass layer, in the form of a transparent glass substrate, with RGB sub-pixels comprising for example color conversion modules.

A first example of assembly method of "SiOx/SiOx bonding" type makes it possible to bond two surfaces, each covered with a layer of SiOx. A drawback of this solution is that, in this assembly method, one step requires a consolidation annealing, for example at 200° C. for 2 hours, to form a bond layer between the SiOx/SiOx layers. Advantageously, this bond layer is transparent for the passage of the emission of light, nevertheless, such an annealing step is harmful for color conversion modules, which are sensitive components at such a temperature. These color conversion modules may be degraded under the action of too high temperature and thereby their conversion efficiency may decrease.

A consolidation annealing step such as described above in the SiOx/SiOx bonding type assembly method may also be harmful for an optoelectronic device comprising a temperature sensitive electronic layer arranged beforehand under an emitting layer (on the side opposite the passage of the light emission). Indeed, if the electronic layer corresponds to a silicon based substrate bearing transistors, for example TFT (thin film transistors) of IGZO (Indium Gallium Zinc Oxide) type, the latter generally do not withstand a temperature exceeding 150° C.

Another example of assembly may be done via a bond layer based on transparent organic adhesive, activated by UV. One drawback of this solution is that the bond layer has not very satisfactory mechanical properties, notably leading to problems of expansion and deformation. The reliability and the resistance of the optoelectronic device are altered. Another drawback of this solution, which comprises a UV activation step, is that it is not possible to use glass substrates opacified before assembly. Yet, transparent glass substrates are difficult to handle by the automatons of the microelectronics industry, which generally resort to optical detection for the handling and the positioning of substrates. This solution is thus not fully compatible with standard industrial methods of microelectronics. Another drawback of this solution is that the bond layer based on transparent organic adhesive does not make it possible to prevent exposure of the color conversion modules to oxygen. The lifetime of the color conversion modules is thereby reduced. There thus exists a need consisting in improving the method for assembling a transparent layer on a structure comprising a layer of components sensitive to temperature and/or environmental conditions, notably an oxidizing atmosphere. One object of the present invention is to meet this need by overcoming at least partially the drawbacks of known solutions.

In particular, one object of the present invention is to propose an optoelectronic device comprising a layer of temperature sensitive components and a transparent support layer, which is reliable and compatible with microelectronics manufacturing methods. Another object of the present invention is to propose a method of manufacturing such an optoelectronic device.

The object, features and advantages of the present invention will become clear on examining the following description and from the accompanying drawings. It is understood that other advantages may be incorporated. In particular, certain features and certain advantages of the device may apply mutatis mutandis to the method, and vice versa.

SUMMARY

In order to attain the aforementioned objectives, one aspect relates to an optoelectronic device comprising in a stack along a direction z:
  at least one emitting layer comprising optically active structures, configured to emit or receive radiation according to a wavelength $\lambda$,
  a bond layer,
  a transparent support layer,
  the optoelectronic device further comprising, in the stack along the direction z, at least one so-called sensitive layer comprising at least one so-called sensitive structure have a temperature resistance below a temperature Tmax.

Advantageously, the bond layer is based on a so-called "low temperature" inorganic bonding material, i.e. able to be implemented at a temperate not degrading the at least one temperature sensitive structure. The mechanical properties of such a bonding material, which is compatible with the presence of the at least one temperature sensitive structure, are more appropriate for an optoelectronic device than an organic adhesive generally used in known solutions. The mechanical strength is improved. The resistance to aging of the device is improved. The reliability of the device is greater than that of known devices. Such a low temperature inorganic bonding material is however generally opaque.

Advantageously, the bond layer comprises cavities directly in line with the optically active structures, between the transparent support layer and the emitting layer comprising the optically active structures. These cavities above the optically active structures enable an optical passage through the bond layer. Thus, the bond layer in a low temperature inorganic bonding material does not prevent the emission or the reception of light to the optically active structures.

According to one example, the so-called sensitive layer is arranged between the emitting layer comprising the optically active structures and the bond layer, the at least one so-called sensitive structure being a color conversion module.

According to another example, the so-called sensitive layer is borne by a substrate arranged under the emitting layer comprising the optically active structures, on the side opposite the bond layer. The at least one so-called sensitive structure being a transistor, preferably a thin film transistor.

According to one example, the device comprises a first sensitive layer arranged between the emitting layer and the bond layer, and a second sensitive layer arranged between a substrate and the emitting layer comprising the optically active structures, on the side opposite the bond layer. The optically active structures are typically light emitting diodes. The first sensitive layer typically comprises at least one first sensitive structure such as a color conversion module. The second sensitive layer typically comprises at least one second sensitive structure such as a transistor, preferably a thin film transistor.

According to one example, the bond layer forms bonding strips that delimit the cavities. Each cavity typically forms a hermetically closed space enclosing the color conversion module such that it is not in contact with the environmental conditions of the device. This makes it possible to limit the degradation of the color conversion module. This makes it possible to maintain its conversion efficiency.

According to one embodiment, the cavities have a pressure below atmospheric pressure, preferably at least one decade below atmospheric pressure.

Advantageously, the cavities are hermetically closed, limiting any phenomenon of oxidation of the color conversion module.

Thus, unlike known solutions based on transparent continuous bond layers (based on organic adhesives or of SiOx/SiOx bonding type), the optoelectronic device according to the present invention comprising a structured inorganic bond layer. Contrary to a technical prejudice, the structuring of the bond layer does not compromise the assembly between the transparent support layer and the emitting layer comprising the optically active structures or between the transparent support layer and the sensitive layer when the latter is present between the emitting layer comprising the optically active structures and the transparent support. The use of a low temperature inorganic bonding material makes it possible to compensate or surpass the decrease in mechanical strength linked to the structuring of the bond layer. The optoelectronic device comprising a structured inorganic bond layer according to the invention thus has a mechanical strength typically greater than or equal to that of a known device comprising an organic continuous bond layer. Such a device further has increased compatibility with microelectronics technologies. In particular, an inorganic bond layer is less critical than a layer based on organic adhesive in terms of contamination of equipment during the method of manufacturing the device.

The device according to the invention is thus easier and/or less costly to manufacture by standard procedures of the microelectronics industry.

According to one embodiment, the inorganic bonding material may be opaque. Advantageously, the bond layer, outside of the cavities, does not allow emitted or received radiation to pass through it. The emission or reception zone is thus indirectly sectioned by the passage through the cavities. Another aspect relates to a method of manufacturing such an optoelectronic device. Advantageously, the method comprises at least the following steps:

supplying a stack comprising at least one emitting layer comprising optically active structures, configured to emit or receive radiation according to a wavelength $\lambda$, and at least one so-called sensitive layer comprising so-called sensitive structures having a temperature resistance below a temperature Tmax.

forming, on the stack, a first bond layer part based on a low temperature inorganic bonding material, said first part including first openings directly in line with the optically active structures, supplying a transparent support layer, forming, on a first face of the transparent support layer, a second bond layer part based on low temperature inorganic bonding material, said second part including second openings configured to be placed in correspondence with the first openings, placing the second bond layer part face to face with the first bond layer part, assembling the stack comprising the sensitive layer with the transparent support layer by low temperature bonding between the first and second bond layer parts, the first and second openings then forming cavities directly in line with the optically active structures.

Thus, the method advantageously makes it possible to manufacture the optoelectronic device described above.

Preferably, the method further comprises an opacification of a second face of the transparent support layer before placing the first and second bond layer parts face to face, and a removal of the second opacified face after assembly of the stack comprising the sensitive layer with the transparent support layer. Opacification before assembly advantageously makes it possible to use equipment and automatons of the microelectronics industry resorting to optical detections of substrates. The opacified support layer further has an increased resistance with respect to plasma or cleaning methods and wet etching methods. The cost of the manufacturing method is thus decreased.

BRIEF DESCRIPTION OF THE FIGURES

The aims, objects, as well as the features and advantages of the invention will appear better from the detailed description of embodiments of the latter which are illustrated by the following accompanying drawings, wherein.

Figure 1A:
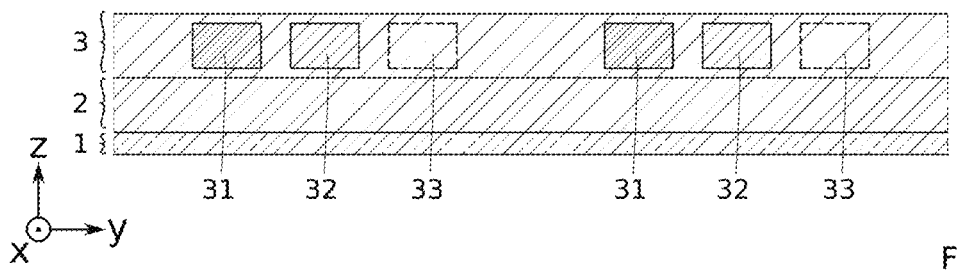
FIGS. 1A to 10 schematically illustrate steps of manufacturing an optoelectronic device according to one or more embodiments of the present invention. The figures noted respectively A and B, preceded by a same number, schematically illustrate two alternatives of the manufacturing method according to the invention, for a same step.

The drawings are given as examples and are not limiting to the invention. They are schematic representations of a principle intended to facilitate the understanding of the invention and are not necessarily on the scale of practical applications. In particular, the dimensions of the different elements constituting the emitting layers are not necessarily representative of reality.

DETAILED DESCRIPTION

Before beginning a detailed review of embodiments of the invention, it is recalled that the invention may notably comprise the optional features hereafter, which may be used in association or alternatively:

According to one example, the stack of layers along z follows the following order:
- the emitting layer comprising the optically active structures,
- the sensitive layer comprising at least one sensitive structure,
- the bond layer,
- the transparent support layer.

According to another example, the stack of layers along z follows the following order:
- the sensitive layer comprising at least one sensitive structure,
- the emitting layer comprising the optically active structures,
- the bond layer,
- the transparent support layer.

According to another example, the stack of layers along z follows the following order:
- a first sensitive layer comprising at least one first sensitive structure,
- the emitting layer comprising the optically active structures,
- a second sensitive layer comprising at least one second sensitive structure,
- the bond layer,
- the transparent support layer.

According to one example, the optically active structures are light emitting diodes. The emitting layer, comprising these optically active structures, is typically formed in a semiconductor material, doped or not. It may be formed in sapphire or even a III-V compound based material, for example GaN, GaAs or InP. It may alternatively involve a silicon type substrate, or a silicon on insulator (SOI) type substrate.

According to one example, the at least one sensitive structure of the sensitive layer is a color conversion module.

According to one example, the at least one color conversion module comprises quantum dots.

According to one example, the at least one sensitive structure of the sensitive layer is a transistor, preferably a thin film transistor.

According to one example, the inorganic low temperature bonding material is opaque.

According to one example, the inorganic low temperature bonding material is based on metal or amorphous metal or amorphous silicon or amorphous germanium. According to one example, the inorganic low temperature bonding material is based on titanium. According to one example, the bond layer comprises a sub-layer based on titanium and a layer based on amorphous silicon.

According to one example, the temperature Tmax is below 180° C., preferably below 150° C.

According to one example, the bond layer has a thickness comprised between 3 nm and 100 nm, preferably between 5 nm and 10 nm.

According to one example, the cavities have a pressure below atmospheric pressure, preferably at least one decade below atmospheric pressure. This implies in particular that the cavities are hermetic. Thus, in the case where the sensitive layer is arranged between the emitting layer comprising the optically active structures and the bond layer, the structures of the sensitive layer are not subjected to a humid or oxidizing atmosphere. The structures of the sensitive layer degrade less quickly over time. The aging of the device is slowed down.

According to one example, the transparent support layer is based on glass.

According to one example, the cavities are transparent to the radiation emitted or received by the optically active structures.

According to one example, the bond layer is formed by an assembly of first and second parts of the inorganic bonding material, deposited respectively on the emitting layer comprising the optically active structures (or the sensitive layer when present between the emitting layer comprising the optically active structures and the bond layer) and on a face of the transparent support layer.

According to one example, the at least one emitting layer comprising the optically active structures is based on GaN or GaAS.

According to one example, the assembly by low temperature bonding is performed at a temperature Tc below the temperature Tmax, preferably such that Tc≤Tmax−20° C., preferably such that Tc≤Tmax−50° C. Tc and Tmax are expressed in degrees Celsius (° C.). The assembly is configured to bond the transparent support layer to the sensitive layer while preserving the sensitive structures.

According to one example, the temperature Tmax corresponds to a temperature above which the sensitive structures thermally degrade.

According to one example, the assembly by low temperature bonding is performed at room temperature or at around 20° C. Advantageously, this type of assembly does not require post-treatment, which is not the case with a polymer bonding which requires an activation by UV, which can damage the sensitive structures. It is not the case either for an oxide/oxide hydrophilic bonding, which requires a consolidation annealing, which can damage the sensitive structures.

According to one example, the method further comprises an opacification of a second face of the transparent support layer before placing the first and second bond layer parts opposite, and a removal of the second opacified face after assembly of the stack comprising the sensitive layer with the transparent support layer. The opacification enables easy handling of the transparent support layer, notably by optical detection equipment and automatons of the microelectronics industry. Advantageously, the assembly by low temperature bonding does not require that the support layer is transparent during assembly, unlike an organic bonding activated by UV.

According to one example, the opacification is performed without temperature limitation, typically at a temperature To above Tmax. The opacification is typically performed separately, before assembly. The opacification may thus be performed without temperature restriction, notably at temperatures above 200° C. The opacification consists in depositing at least one opaque layer, generally a metal, Ti or TiN for example, optionally encapsulated by a dielectric. An opacification by deposition of such an opaque layer is more robust with respect to later cleaning or HF based wet removal treatments, and may advantageously be implemented within the scope of the method for manufacturing the device.

According to one example, the assembly by low temperature bonding is performed at a pressure Pc below atmospheric pressure Patm, preferably such that Pc≤10$^{-3}$·Patm, and preferably such that Pc≤10$^{-8}$·Patm. The pressure Pc is for example of the order of 5.10$^{-6}$ Patm. The low temperature bonding is typically performed under vacuum or under ultra vacuum. This makes it possible to conserve dangling bonds after stripping of the native oxide for amorphous silicon based bond layer parts. The bonding quality is improved. Consequently, the cavities thus formed are sealed and under vacuum. This makes it possible to protect the sensitive structures, which are hermetically closed with respect to a humid or oxidizing atmosphere.

According to one example, the inorganic low temperature bonding material is chosen based on metal or amorphous metal or amorphous silicon. According to one example, the inorganic low temperature bonding material is chosen based on amorphous germanium.

According to one example, the first and second openings are formed in a symmetrical manner in the first and second bond layer parts. This makes it possible to better spread out the mechanical forces between the bond layer, the support layer and the sensitive layer. The distribution of the mechanical stresses is more homogeneous. The mechanical stresses in the device are potentially limited. The first and second openings formed in a symmetrical manner do not necessarily imply that the first and second bond layer parts are of equal thicknesses.

According to one example, the first bond layer part is firstly formed continuously on the sensitive layer of the stack, then the first openings are formed in the first bond layer part.

According to one example, the second bond layer part is firstly formed continuously on the first face of the transparent support layer, then the second openings are formed in the second bond layer part.

Unless incompatible, technical features described in detail for a given embodiment may be combined with the technical features described in the context of other embodiments described for exemplary and non-limiting purposes, so as to form another embodiment which is not necessarily illustrated or described. Of course, such an embodiment is not excluded from the invention.

"Optoelectronic device" is taken to mean a device suited to emitting, conveying, or receiving light. According to one particular application, such an optoelectronic device comprises light emitting diodes (LED), in particular LEDs forming the sub-pixels of an emissive screen pixel.

The invention may be implemented more largely for different optoelectronic devices. The invention may for example be implemented within the scope of laser or photovoltaic devices.

The LEDs or optoelectronic devices typically have, within the scope of the present invention, dimensions, in projection in a plane of base xy, less than 100 μm×100 μm, preferably less than 10 μm×10 μm.

Unless explicitly stated, it is specified that, within the scope of the present invention, the relative disposition of a second layer intercalated between a first layer and a third layer does not obligatory signify that the layers are directly in contact with each other, but signifies that the second layer is either directly in contact with the first and third layers, or separated therefrom by at least one other layer or at least one other element.

Thus, the terms and phrases "bear on", "surmount", "cover" or "overlap" do not necessarily signify "in contact with".

The steps of the method as claimed should be understood in the broad sense and could possibly be carried out in several sub-steps.

In the present patent application, the terms "light-emitting diode", "LED" or simply "diode" are interchangeably used. A "LED" may also mean a "micro-LED" or a "smart LED".

A substrate, a layer, a device, "based on" a material M, or M-based, is taken to mean a substrate, a layer, a device comprising only this material M or this material M and possibly other materials, for example alloying elements, impurities or doping elements. Thus, a GaN-based diode typically comprises GaN and AlGaN or InGaN alloys.

A mark, preferably orthonormal, comprising the axes x, y, z is represented in certain appended figures. The mark is applicably by extension to the other figures.

In the present patent application, mention will preferentially be made about a thickness for a layer and about a height for a structure or a device. The thickness is considered along to a direction normal to the main extension plane of the layer, and the height is considered perpendicularly to the base plane xy. Thus, a layer typically has a thickness along z, when it extends mainly along a plane xy, and a projecting element, for example a color conversion module, has a height along z. The relative terms "on", "under", "underlying" preferentially refer to positions taken along the direction z. In the present application, "vertical", "vertically" signify "directed along the direction z" and "lateral", "laterally" signify "directed along a direction of the plane xy".

Within the scope of the present invention, a transparent object or a material signifies that the object or the material allows at least 90% of the light intensity of the light beam that traverses it to pass through. Conversely, a material or a surface is considered as "opaque" from the moment that it absorbs or stops at least 85% of the intensity of an incident light beam.

"Temperature resistance" of a structure is taken to mean the maximum temperature at which the integrity of the structure is not thermally degraded.

"Low temperature inorganic bonding material" is taken to mean an inorganic material able to be used in a low temperature bonding method, i.e. implemented at a temperature below 200° C., preferably at a temperature below 180° C., and preferably at a temperature below 150° C. The low temperature inorganic bonding material is typically implemented at room temperature, without requiring a consolidation annealing.

The dimensional values extend to within the manufacturing and measurement tolerances.

The terms "substantially", "around", "of the order of" signify, when they refer to a value, "to within 10%" of this value or, when they refer to an angular orientation, "to within 10°" of this orientation. Thus, a direction substantially normal to a plane means a direction having an angle of 90±10° with respect to the plane.

FIGS. 1A to 8 illustrate steps of producing an optoelectronic device comprising optically active structures surmounted by a sensitive layer 3 and a transparent support layer.

In this exemplary embodiment, the optically active structures are LEDs based on GaN configured to emit light radiation at a first wavelength λ1 in the blue or in the UV. These LEDs are typically borne by a GaN based substrate and encapsulated to form the emitting layer 2. The LEDs may have a planar (2D) architecture within the emitting layer 2. In this case, each LED may comprise a plurality of layers superimposed along z. Such a stack of layers typically comprises an active layer intercalated between an electron injection layer and a hole injection layer. The active layer emits light radiation of wavelength λ1 by radiative recombination of electrons and holes. According to another possibility, the LEDs may have a three-dimensional (3D) architecture within the emitting layer 2. In this case, each LED may comprise a set of semiconductor nanopyramids and/or nanowires, preferably mainly directed along z, embedded in a dielectric material based matrix. The semiconductor nanowires typically each comprise an active region intercalated between an electron injection region and a hole injection region. The active region emits the light radiation of wavelength λ1 by radiative recombination of electrons and holes. The sensitive layer 3 is a layer comprising temperature sensitive structures. In this exemplary embodiment, the sensitive layer 3 comprises color conversion modules 31, 32, 33. A color conversion module may be for example in the form of a diffusing photoluminescent block comprising luminophores, or a photoluminescent block comprising particles of at least one photoluminescent material, dispersed for example in a transparent matrix (i.e. photosensitive resin). The luminophores are configured, when they are excited by the light emitted by the light emitting diodes, to emit light at a different wavelength to the wavelength of the light emitted by the light emitting diodes. The photoluminescent particles may be in the form of quantum dots, i.e. in the form of semiconductor microcrystals of which the quantum confinement is substantially three-dimensional. The quantum dots may be formed from at least one semiconductor compound, which may be selected from cadmium selenide (CdSe), indium phosphide (InP), indium gallium phosphide (InGaP), cadmium sulfide (CdS), zinc sulfide (ZnS), cadmium (CdO) or zinc (ZnO) oxide, cadmium zinc selenide (CdZnSe), zinc selenide ZnSe) doped for example with copper or manganese, graphene or from i.e. other semiconductor materials being able to be suitable. The quantum dots may also have a core/shell type structure, such as CdSe/ZnS, CdSE/CdS, CdSe/CdS/ZnS, PbSe/PbS, CdTe/CdSe, CdSe/ZnTe, InP/ZnA or other. The size and/or the composition of the photoluminescent particles are chosen as a function of the desired luminescence wavelength.

Another example of a photoluminescent material is yttrium aluminum garnet (YAG) activated by trivalent cerium ion, also called YAG:Ce or YAG:Ce$^{3+}$. Typically, a photoluminescent block comprises a matrix of an inorganic or organic material in which are optionally dispersed monocrystalline particles of nanometric size of a semiconductor material, also called semiconductor nanocrystals or nanoluminophore particles. The color conversion modules 31, 32, 33 surmount the LEDs of the emitting layer 2. Here, the color conversion modules 31, 32 are configured to convert the first wavelength λ1 coming from LEDs into another wavelength.

Typically, the color conversion module 31 is configured to convert the first wavelength λ1 into a second wavelength λ2 in the red. The color conversion module 32 is configured to convert the first wavelength λ1 into a third wavelength λ3 in the green. Schematically, to form a pixel, at least three green, red, blue sub-pixels are required. Thus, to obtain the blue sub-pixel (in the range from 430 nm to 490 nm), it suffices to transmit the first wavelength λ1 coming from a first LED located under the site 33. To obtain the red sub-pixel (in the range from 580 nm to 700 nm), the color conversion module 31 is placed above a second LED. To obtain the green sub-pixel (in the range from 500 nm to 560 nm), the color conversion module 32 is placed above a third LED. These color conversion modules 31, 32 are integrated within a transparent layer, for example based on silicon oxide. This layer 3 placed above the emitting layer 2, is a temperature sensitive layer. It is also called "conversion layer" 3 hereafter. The color conversion modules 31, 32 degrade for example above around 150° C. To preserve the functionality/integrity and the performances of these color conversion modules 31, 32, the following manufacturing steps involving the sensitive layer 3 must not exceed 150° C. According to one possibility, the first wavelength λ1 coming from the LEDs belongs to the UV domain, and three color conversion modules 31, 32, 33 are used to convert the first wavelength λ1 respectively into a wavelength in the red, in the green and in the blue.

According to a preferred possibility, groups of LEDs of the emitting layer 2 are connected to independent control electronics to form "smart pixels". The optoelectronic device may thus comprise an electronic layer under the emitting layer 2. This electronic layer may correspond to a silicon based substrate 1 bearing transistors, for example complementary metal-oxide-semiconductor (CMOS) transistors or thin film transistors (TFT), for example of LTPS (low temperature polycrystalline silicon) type, or IGZO (indium gallium zinc oxide) type, the latter generally do not withstand a temperature exceeding 150° C. Thus, the electronic layer may be hereafter called sensitive layer 3' comprising at least one so-called sensitive structure, the so-called sensitive structure corresponding for example to a thin film transistor.

Interconnections between the electronic layer 3' and the emitting layer 2 are typically present. Such an assembly makes it possible to produce so-called "smart LEDs". A smart LED typically comprises an optically active structure connected to a dedicated drive electronic, based on transistors.

Figure 1B:
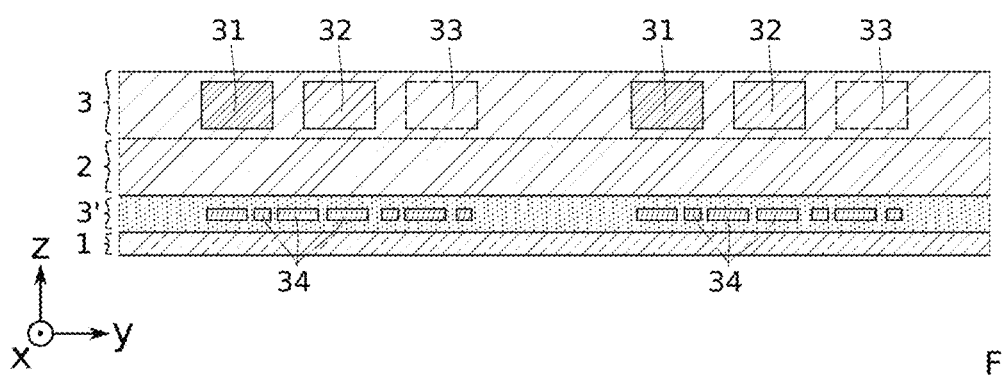

FIG. 1 illustrates here a first part of the optoelectronic device comprising, in a stack along z, a substrate 1 for example silicon based, an emitting layer 2 for example GaN based, and a temperature sensitive conversion layer 3. FIG. 1B illustrates in an alternative a first part of the optoelectronic device comprising, in a stack along z, a substrate 1 bearing an electronic layer 3' comprising transistors 34 sensitive or not to temperature, an emitting layer 2, and a temperature sensitive conversion layer 3.

The following manufacturing steps of the optoelectronic device aim to form by assembly a transparent support layer on the conversion layer 3.

Figure 2:
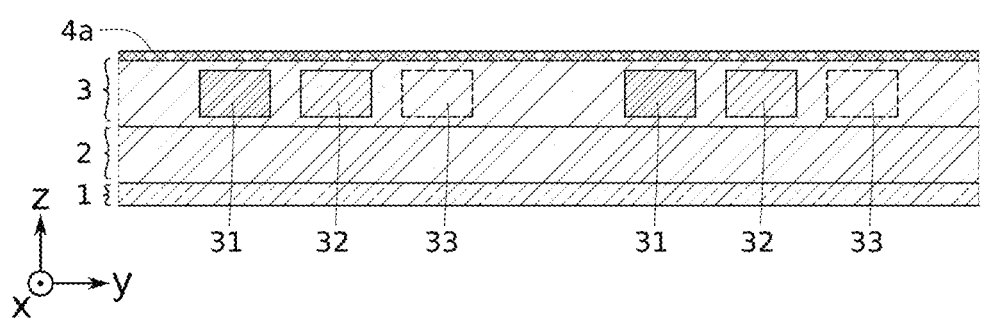

As illustrated in FIG. 2, a first bond layer part 4a is formed continuously on the conversion layer 3. This first bond layer part 4a is based on an inorganic low temperature bonding material, for example a metal and/or amorphous silicon or amorphous germanium. The formation of this first bond layer part 4a is performed at low temperature in order to preserve the structures 31, 32, 33 of the conversion layer 3. An example of low temperature deposition of amorphous silicon, at temperatures of 75° C. and 100° C., is disclosed in the document "Low-temperature deposition of amorphous silicon solar cells, C. Koch et al., Solar Energy Materials and Solar Cells, Volume 68, Issue 2, May 2001, Pages 227-236". The inorganic low temperature bonding material is typically opaque. Within the scope of the development of the present invention, it has been identified that absorption due to the opacity of the inorganic bonding material is not significant, when it involves for example a thick silicon interface of 10 nm. On the other hand, it has appeared that the reflection brought about by the bond layer drastically decreases the emission of the underlying structures. The solution that has been developed consists in forming openings in the bond layer, above the emission zones of the layers 2, 3, to avoid in particular parasitic reflections.

Figure 3:
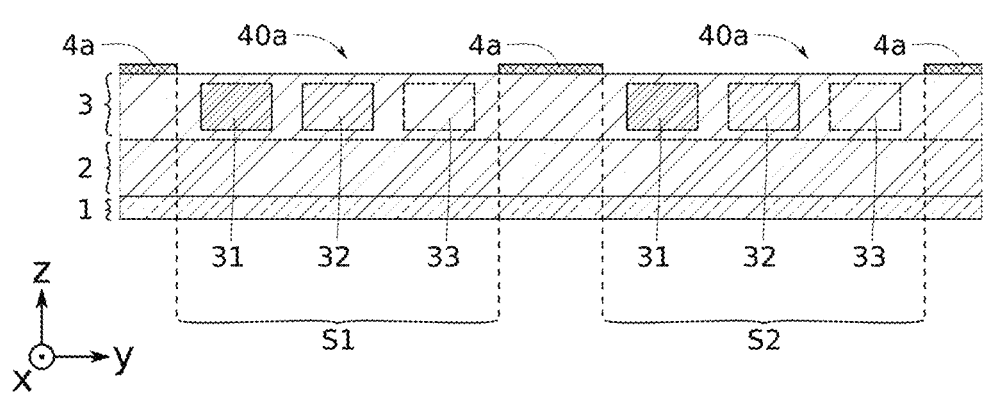

As illustrated in FIG. 3, first openings 40a are formed in known manners, typically by lithography and etching, in the first bond layer 4a, above the emission zones S1, S2 of the emission 2 and conversion 3 layers. The layer 3 is exposed through the first openings 40a.

Figure 4A:
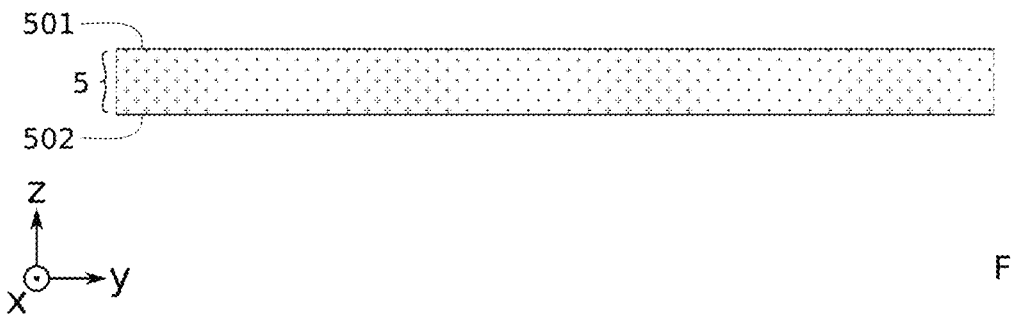

FIG. 4A illustrates a transparent support layer 5 in the form of glass substrate, having a first face 501 and a second face 502. This transparent support layer 5 is supplied independently of the stack of electronic, emission 2, conversion 3 layers.

Figure 4B:
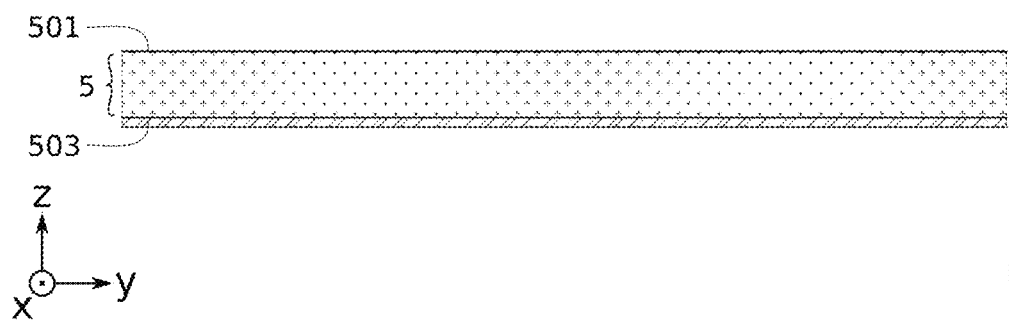

According to a preferred possibility illustrated in FIG. 4B, the transparent support layer 5 is opacified beforehand at one face, for example by depositing a metallic opaque layer 503 on the face. At this stage, the opacification may be performed without temperature limitation, separately from the rest of the stack of electronic, emission 2, conversion 3 layers. This makes it possible to implement robust opacification methods, with an opacification resistant to chemical cleaning treatments or resin removal methods used in photolithography. The opacified transparent support layer 5 may be handled easily by automatons of equipment of the microelectronics industry, which resort to optical detection.

Figure 5:
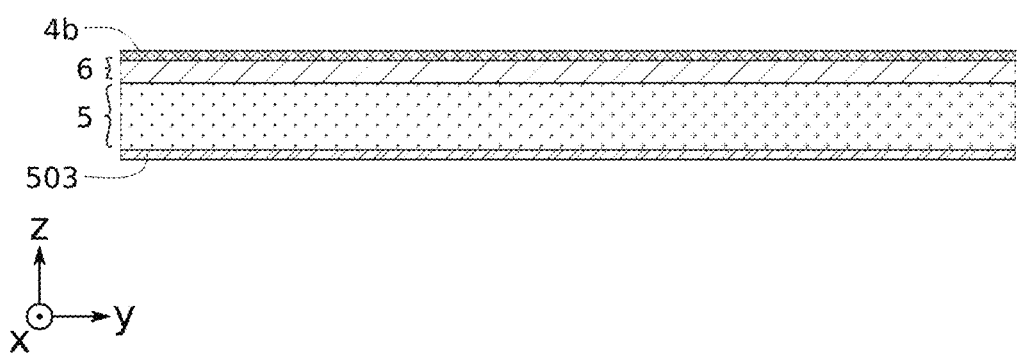

As illustrated in FIG. 5, optionally a transparent layer 6 based on silicon oxide may be deposited on the face of the transparent support layer 5 opposite the opacified face 503. A planarization by chemical mechanical polishing CMP may next be performed to obtain a surface condition suited to the deposition of a second bond layer part 4b. The second bond layer part 4b is typically based on the same inorganic low temperature bonding material as the first bond layer part 4a. It is for example based on amorphous silicon. The first and second bond layer parts 4a, 4b typically have roughnesses Ra<1 nm, preferably Ra<0.5 nm.

Figure 6:
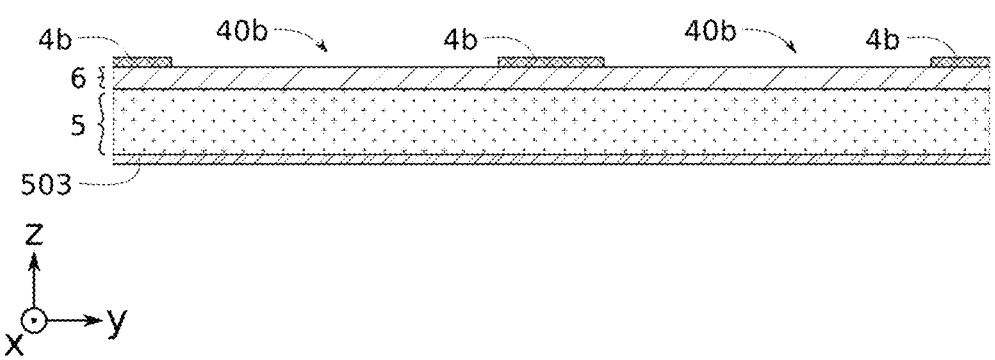

As illustrated in FIG. 6, after continuously depositing the second bond layer part 4b, second openings 40b are formed in known manners, typically by lithography and etching, in the second bond layer part 4b. The layer 6 is exposed through the second openings 40b. The second openings 40b are configured to correspond at least in part and preferably totally to the first openings 40a. Thus, the second openings 40b have the same shapes and dimensions as the first openings 40a, according to a symmetry with respect to the plane xy. This makes it possible to optimize the later formation of the cavities 40 detailed hereafter in FIG. 8.

Figure 7:
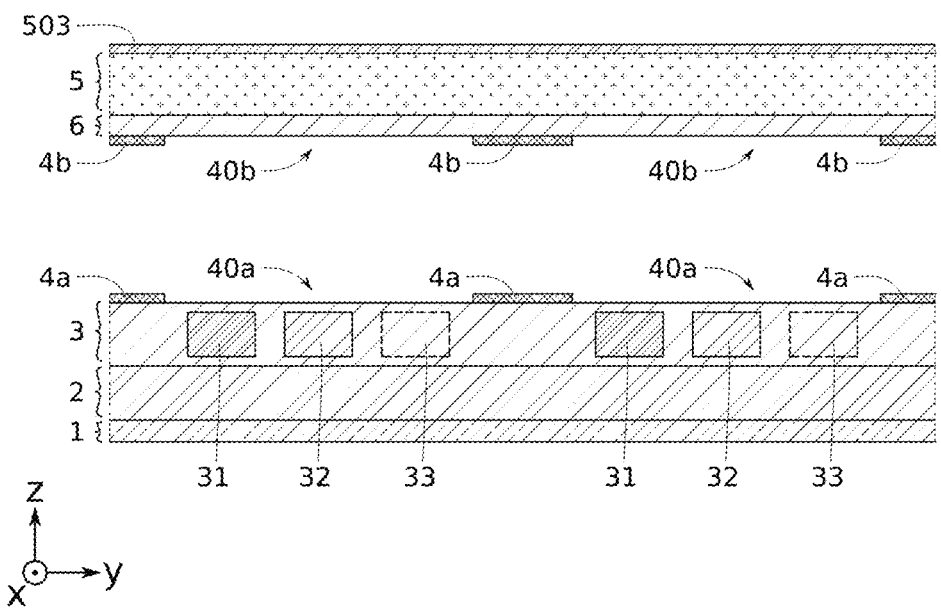

As illustrated in FIG. 7, after formation of the first and second bond layer parts 4a, 4b on the stack of electronic, emission 2, conversion 3 layers on the one hand and on the transparent support layer 5 on the other hand, they are placed opposite each other and aligned with each other with a view to being assembled.

Figure 8:
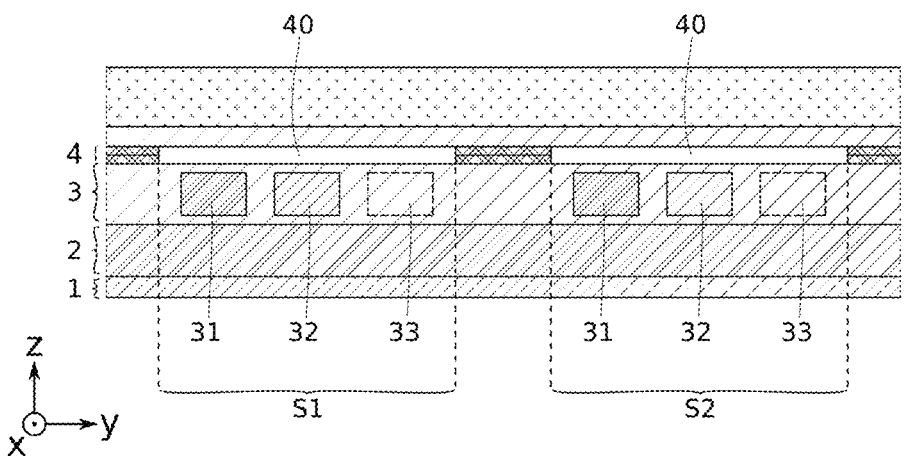

FIG. 8 illustrates this assembly. The metal/metal or amorphous silicon/amorphous silicon or amorphous germanium/amorphous germanium assembly between the parts 4a, 4b is typically done at room temperature, for example according to a surface activation assembly method. According to this method, the surfaces of the parts 4a, 4b may be activated by a bombardment of argon atoms under vacuum before bonding. Such a method is for example described in the document "Surface activated bonding of silicon wafers at room temperature, H. Takagi et al., Appl. Phys. Lett. 68, 2222-2224 (1996)". This assembly method may be implemented with an EVG® ComBond® equipment. Covalent bonds are typically formed between the parts 4a, 4b to obtain the bond layer 4 and the cavities 40. The cavities 40 are directly in line with the optically active structures corresponding to the emission zones S1, S2 of the emission 2 and conversion 3 layers, between the transparent support layer and the sensitive layer. These cavities 40 above the optically active structures enable an optical passage through the bond layer, i.e. are transparent to the wavelengths emitted by the emission zones S1, S2. After assembly, the opaque layer on the support layer 5, or the opacified face of the support layer 5, is removed, typically by mechanical trimming and/or chemical mechanical polishing, in order to obtain a transparent support layer 5 for the device. The opaque layer may also be removed by plasma etching or wet etching.

Thus, at the end of assembly, the optoelectronic device typically comprises, in a stack along z:
- an electronic layer comprised in a substrate 1 comprising transistors,
- an emissive layer 2 comprising LEDs based on GaN,
- a conversion layer 3 comprising color conversion modules 31, 32, 33,
- a bond layer 4 comprising cavities 40 above emission zones S1, S2 of the emission 2 and conversion 3 layers,
- a transparent support layer 5.

Figure 9:
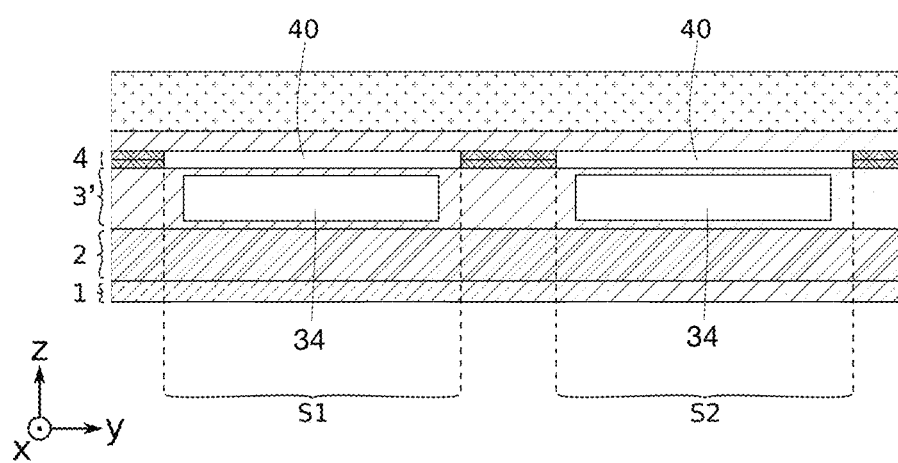
Figure 10:
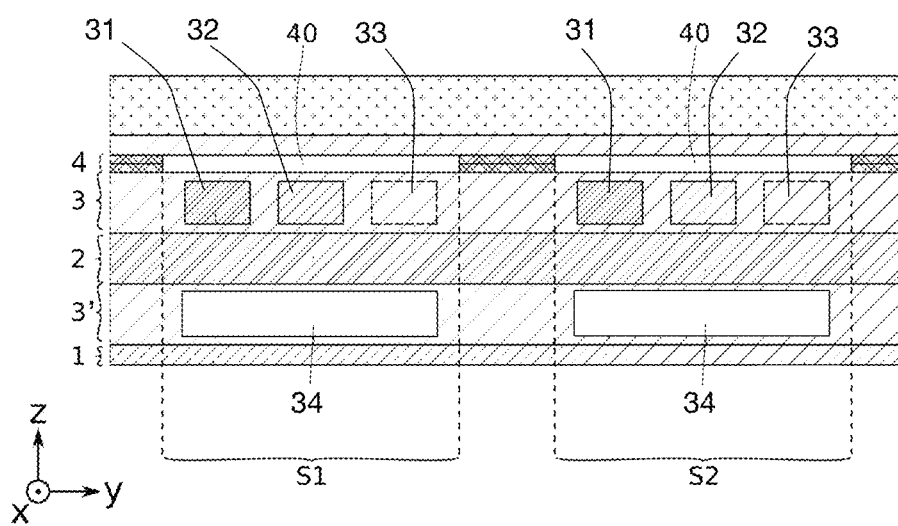

FIG. 9 illustrates the FIG. 8 assembly in an embodiment where a sensitive layer 3' comprises two transistors 34 above corresponding emission zones S1 and S2. FIG. 10 illustrates the FIG. 8 assembly in an embodiment having first and second sensitive layers 3 and 3'.

Advantageously, during the manufacture of the device, the temperature sensitive color conversion modules 31, 32, 33 are not exposed to temperatures above 150° C. The color conversion modules 31, 32, 33 have been preserved. Advantageously, the cavities 40 are hermetic and under vacuum. This prevents the conversion layer 3 being exposed to a humid or oxidizing atmosphere. The lifetime of the conversion layer 3 is increased.

Advantageously, the pixels each comprising for example the RGB sub-pixels, are separated by cutting to be displaced then fixed to another substrate. The cutting may for example be done by mechanical sawing or laser cutting, through the stack specifically at the assembly of the parts 4a, 4b of the bond layer 4. The cutting will be easier in the present invention than with an organic adhesive based bond layer.

The invention of not restricted to the embodiments described previously. The optically active layer 2 may comprise light receptor components, such as detectors. The sensitive layer 3 may comprise any temperature sensitive structure, in particular structures that degrade thermally above 200° C., or even above 150° C.

The invention claimed is:

1. An optoelectronic device comprising in a stack along a direction z:
   - at least one emitting layer comprising optically active structures, configured to emit or receive radiation according to a wavelength k,
   - a bond layer, and
   - a transparent support layer,
   - the optoelectronic device further comprising, in the stack along the direction z, a sensitive layer comprising at least one sensitive structure having a temperature resistance below a temperature Tmax,
   - wherein the bond layer is based on a low temperature inorganic bonding material and in that the bond layer comprises cavities directly in line with the optically active structures, between the transparent support layer and the emitting layer comprising said optically active structures.

2. The device according to claim 1 wherein the temperature Tmax is below 180° C. and wherein the bond layer is between the transparent support layer and the sensitive layer in the direction z.

3. The device according to claim 1 wherein the low temperature inorganic bonding material is opaque and wherein the bond layer is on an opposite side of the sensitive layer from the emitting layer in the direction z.

4. The device according to claim 1 wherein the low temperature inorganic bonding material is based on metal or amorphous silicon or amorphous germanium and wherein the sensitive layer is below the bond layer in the direction z.

5. The device according to claim 1 wherein the cavities have a pressure below atmospheric pressure and wherein the sensitive layer is on an opposite side of the bond layer from the transparent support layer in the direction z.

6. The device according to claim 1 wherein the cavities are transparent to the radiation emitted or received by the optically active structures.

7. The device according to claim 1 wherein the transparent support layer is based on glass.

8. The device according to claim 1 wherein the bond layer is formed by an assembly of first and second parts of the inorganic bonding material, deposited respectively on the sensitive layer and on a face of the transparent support layer.

9. The device according to claim 1 wherein said emitting layer comprising the optically active structures is based on GaN or GaAs.

10. The device according to claim 1 wherein the optically active structures are light emitting diodes and wherein the sensitive layer is arranged between the emitting layer and the bond layer, said at least one sensitive structure is a color conversion module.

11. The device according to claim 10 wherein at least one color conversion module comprises quantum dots.

12. The device according to claim 1 wherein the optically active structures are light emitting diodes and wherein the sensitive layer is borne by a substrate arranged under the emitting layer comprising the optically active structures, on the side opposite the bond layer, said at least one sensitive structure being a transistor.

13. The device according to claim 1, wherein the optically active structures are light emitting diodes, the device comprising a first sensitive layer arranged between the emitting layer and the bond layer, and a second sensitive layer arranged between a substrate and the emitting layer comprising the optically active structures, on the side opposite the bond layer, the first sensitive layer comprising at least one sensitive structure, the second sensitive layer comprising at least one second sensitive structure.

14. A method of manufacturing an optoelectronic device according to claim 1, said method comprising at least the following steps:
supplying a stack comprising the at least one emitting layer comprising the optically active structures, configured to emit or receive radiation according to a wavelength λ, and the at least one sensitive layer comprising sensitive structures having a temperature resistance below a temperature Tmax,
forming, on the stack, a first bond layer part based on the low temperature inorganic bonding material, said first part including first openings directly in line with the optically active structures,
supplying the transparent support layer,
forming, on a first face of the transparent support layer, a second bond layer part based on the low temperature inorganic bonding material, said second part including second openings configured to be placed in correspondence with said first openings,
placing the second bond layer part face to face with the first bond layer part, and
assembling the stack comprising the sensitive layer with the transparent support layer by low temperature bonding between the first and second bond layer parts, the first and second openings then forming cavities directly in line with the optically active structures.

15. The method according to claim 14 wherein the first bond layer part is firstly formed continuously on the sensitive layer of the stack, then the first openings are formed in the first bond layer part.

16. The method according to claim 14, wherein the second bond layer part is firstly formed continuously on the first face of the transparent support layer, then the second openings are formed in the second bond layer part.

17. The method according to claim 14 further comprising an opacification of a second face of the transparent support layer before placing the first and second bond layer parts face to face, and a removal of the opacified second face after assembly of the stack comprising the sensitive layer with the transparent support layer.

18. The method according to claim 17 wherein the opacification is performed without temperature limitation.

19. The method according to claim 14 wherein the assembly by low temperature bonding is performed under a pressure Pc below atmospheric pressure Patm.

20. The method according to claim 14 wherein the low temperature inorganic bonding material is chosen from metal or amorphous silicon or amorphous germanium.

* * * * *